(12) United States Patent
Panda et al.

(10) Patent No.: US 7,754,615 B2
(45) Date of Patent: Jul. 13, 2010

(54) METHOD AND APPARATUS FOR DETECTING ENDPOINT IN A DRY ETCHING SYSTEM BY MONITORING A SUPERIMPOSED DC CURRENT

(75) Inventors: Siddhartha Panda, Kanpur (IN); Richard Wise, Newbugh, NY (US); Lee Chen, Cedar Creek, TX (US); Michael Sievers, Poughkeepsie, NY (US)

(73) Assignees: Tokyo Electron Limited, Tokyo (JP); International Business Machines Corporation ("IBM"), Armonk, NY (US)

( * ) Notice: Subject to any disclaimer, the term of this patent is extended or adjusted under 35 U.S.C. 154(b) by 922 days.

(21) Appl. No.: 11/495,725

(22) Filed: Jul. 31, 2006

(65) Prior Publication Data

US 2008/0026488 A1   Jan. 31, 2008

(51) Int. Cl.
*H01L 21/302* (2006.01)
(52) U.S. Cl. ............................ 438/714; 438/9; 438/706; 438/729; 154/345.28

(58) Field of Classification Search ................ 438/7, 438/706, 710, 712, 714, 720, 9, 729; 156/345.3, 156/345.25, 28
See application file for complete search history.

(56) References Cited

U.S. PATENT DOCUMENTS

| | | | | |
|---|---|---|---|---|
| 5,198,072 | A * | 3/1993 | Gabriel | 216/59 |
| 7,048,837 | B2 * | 5/2006 | Somekh et al. | 204/192.13 |
| 2004/0058552 | A1 * | 3/2004 | Higuchi | 438/710 |

* cited by examiner

*Primary Examiner*—Lan Vinh
(74) *Attorney, Agent, or Firm*—Oblon, Spivak, McClelland, Maier & Neustadt, L.L.P.

(57) ABSTRACT

A method and apparatus for detecting the endpoint in a dry plasma etching system comprising a first electrode (e.g., upper electrode) and a second electrode (e.g., lower electrode) upon which a substrate rests is described. A direct current (DC) voltage is applied between the first electrode and a ring electrode surrounding the second electrode, and the DC current is monitored to determine the endpoint of the etching process. The DC current is affected by the impedance of the plasma, and therefore responds to many variations including, for example, the plasma density, electron/ion flux to exposed surfaces, the electron temperature, etc.

12 Claims, 8 Drawing Sheets

METHOD AND APPARATUS FOR DETECTING ENDPOINT IN A DRY ETCHING SYSTEM BY MONITORING A SUPERIMPOSED DC CURRENT

BACKGROUND OF THE INVENTION

1. Field of the Invention

The present invention relates to a method and apparatus for plasma processing a substrate, and more particularly to a method and system for monitoring a plasma process in order to determine an endpoint to the plasma process.

2. Description of Related Art

During semiconductor processing, a (dry) plasma etch process can be utilized to remove or etch material along fine lines or within vias or contacts patterned on a substrate. The plasma etch process generally involves positioning a semiconductor substrate with an overlying patterned, protective layer, for example a photoresist layer, in a processing chamber. Once the substrate is positioned within the chamber, an ionizable, dissociative gas mixture is introduced within the chamber at a pre-specified flow rate, while a vacuum pump is throttled to achieve an ambient process pressure.

Thereafter, plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, etc.) in the selected regions of the substrate. Such substrate materials where etching is required include silicon dioxide ($SiO_2$), low-k dielectric materials, poly-silicon, silicon, and silicon nitride.

As the circuit ground-rules continue to shrink, the sensitivity of materials to the plasma etch process increases and, hence, the effective determination of the endpoint for the etch process becomes evermore critical. The endpoint techniques utilized can be broadly classified into two categories, namely: (i) optical and (ii) electrical-based techniques.

Optical emission spectrometry (OES) has been commonly used to determine the endpoint of an etch process. This approach relies on the monitoring of the emission of an excited chemical species present in the etch process. However, there are limitations to this technique, as not all excited chemical species are emissive or strong emitters. Therefore, the application of OES to etch processes is limited only to certain etch chemistries. Furthermore, the ability to decipher the endpoint is complicated by the composition of the etch stop layer, since the etch stop layer can introduce chemical species that emit in the spectral region of interest. Since in these instances, the endpoint can not be accurately determined, a finite loss of the etch stop layer is inevitable, which may, in turn, damage the underlying device. Furthermore, this technique requires a high signal-to-noise ratio. For example, in processes having low pressure or low pattern factors, even when emitting chemical species exist, the reliable collection of the emission signal becomes an issue rendering the technique ineffective.

Interferometric methods have also been used to monitor endpoint. With this technique, a monochromatic beam (e.g., from a He—Ne laser source at 632.8 nm) is incident on the substrate being etched. The interference patterns, which evolve from the dynamically etched film and the stack underneath, are used to calibrate endpoint. Variations in the topography and film thicknesses, which are inherent to the process flow, modify the interference patterns and thus affect the reliability of this method. Moreover, the sampling of data on the substrate is limited to the area exposed to the incident beam. As with OES, an optical window, through which optical signals are passed, is required to preserve vacuum conditions. As an etch process or processes proceed, the transmission properties for the optical window degrade due to the accumulation of process residue which leads to a loss of signal.

Another technique for determining the endpoint of an etch process includes monitoring the self-bias potential (e.g., see U.S. Pat. No. 6,517,670, U.S. Pat. No. 6,297,165, U.S. Pat. No. 5,198,072, JP01151234A, U.S. Pat. No. 6,562,187, U.S. Pat. No. 6,811,362). The substrate in contact with the plasma develops a negative direct current (DC) potential due to a difference in the flux of electrons and ions arising from the differences in mobility. The material of interest being etching on the substrate contributes to the plasma impedance of the circuit, and thus to the bias (DC) potential. Upon completion of the etch process, the circuit impedance changes resulting in a shift in the DC potential which can be utilized to identify endpoint for the process. In yet another example, Japanese patent JP59043881 inspects the DC bias through the substrate. However, this approach causes a dilution of the endpoint signal because only current propagating through the substrate is sampled.

SUMMARY OF THE INVENTION

The present invention relates to a method and system for etching a substrate.

According to one embodiment, a method and system is described for determining the endpoint of an etch process.

According to another embodiment, a method for etching a substrate, and a computer readable medium with program instructions to cause a computer system to control a plasma processing system for etching a substrate, are described, comprising: disposing the substrate on a first electrode in the plasma processing system; forming plasma by coupling radio frequency (RF) power to the plasma processing system; exposing the substrate to the plasma to facilitate an etch process; coupling a direct current (DC) voltage to a second electrode opposing the first electrode; and monitoring the DC current through the plasma between the second electrode and a ring electrode surrounding the first electrode.

According to yet another embodiment, a plasma processing system configured to etch a substrate is described, comprising: a plasma processing chamber configured to facilitate the formation of plasma; a first electrode coupled to the plasma processing chamber and configured to support the substrate; a second electrode coupled to the plasma processing chamber and configured to contact the plasma; an AC power system coupled to the plasma processing chamber, and configured to couple at least one AC signal to the first electrode or the second electrode or both in order to form the plasma; a DC power system coupled to the plasma processing chamber and configured to couple a DC voltage to the second electrode; a ring electrode surrounding the first electrode and configured to contact the plasma; and a monitoring system coupled to the plasma processing chamber and configured to monitor the DC current between the second electrode and the ring electrode.

DETAILED DESCRIPTION OF PREFERRED EMBODIMENTS

In the following description, for purposes of explanation and not limitation, specific details are set forth, such as a particular geometry of the plasma processing system and descriptions of various processes. However, it should be understood that the invention may be practiced in other embodiments that depart from these specific details.

In material processing methodologies, pattern etching comprises the application of a thin layer of light-sensitive material, such as photoresist, to an upper surface of a substrate that is subsequently patterned in order to provide a mask for transferring this pattern to the underlying thin film on a substrate during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photoresist), or non-irradiated regions (as in the case of negative resist) using a developing solvent. Moreover, this mask layer may comprise multiple sub-layers.

During pattern etching, a dry plasma etching process is often utilized, wherein plasma is formed from a process gas by coupling electromagnetic (EM) energy, such as radio frequency (RF) power, to the process gas in order to heat electrons and cause subsequent ionization and dissociation of the atomic and/or molecular composition of the process gas. Furthermore, negative, high voltage direct current (DC) electrical power can be coupled to the plasma processing system in order to create a ballistic electron beam that strikes the substrate surface during a fraction of the RF cycle, i.e., the positive half-cycle of the coupled RF power. It has been observed that the ballistic electron beam can enhance the properties of the dry plasma etching process by, for example, improving the etch selectivity between the underlying thin film (to be etched) and the mask layer, reducing charging damage such as electron shading damage, etc. Additional details regarding the generation of a ballistic electron beam are disclosed in pending U.S. patent application Ser. No. 11/156,559, entitled "Plasma processing apparatus and method" and published as US patent application no. 2006/0037701A1; the entire contents of which are herein incorporated by reference in their entirety.

The imposition of a DC voltage across the plasma, as described above, leads to the formation of a DC current through the plasma. Since the DC current through the plasma depends strongly on the plasma impedance, then variations in the plasma impedance can affect changes in the DC current. For example, the plasma impedance varies with several plasma parameters including, but not limited to: (i) plasma density which depends significantly on the gas phase chemistry; (ii) electron/ion flux to surfaces exposed to the plasma; and (iii) electron temperature which also depends significantly on the gas phase chemistry. Any variation in the substrate surface chemistry or any change in the substrate surface dielectric constant or a combination thereof will affect variations in the flux of charged species. Therefore, the inventors have observed that the monitoring of variations in the DC current may be utilized to characterize the state of the plasma. For instance, the monitoring of the DC current can be used to determine the endpoint for the etching process.

Figure 1:
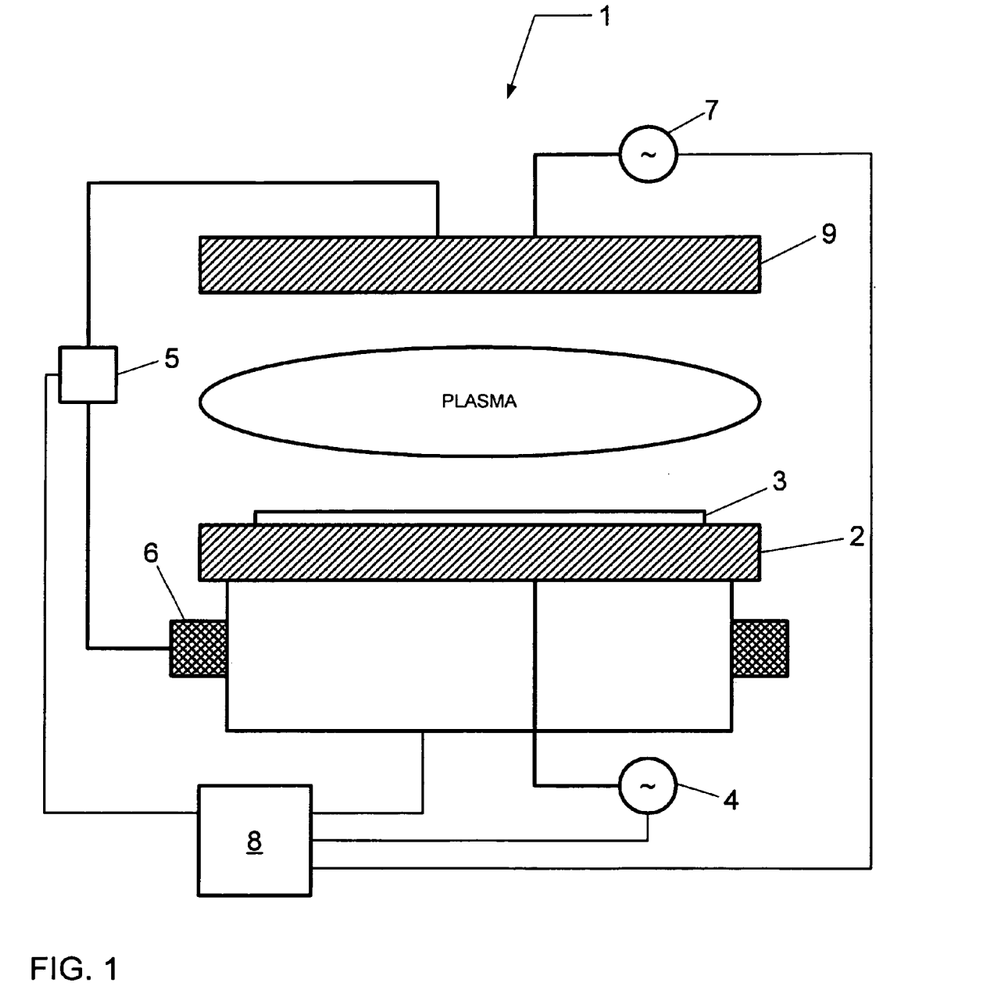
FIG. 1 presents a schematic representation of a plasma processing system according to an embodiment of the invention.

Referring now to FIG. 1, a schematic illustration of a plasma processing system incorporating a system for monitoring such a DC current is provided according to one embodiment. The plasma processing system 1 comprises a first electrode 2 and a second electrode 9 disposed opposite each other within a process chamber, wherein the first electrode 2 is configured to support a substrate 3. The first electrode 2 may be coupled to a first RF power system 4 configured to provide RF power at a first RF frequency, while the second electrode 9 may be coupled to a second RF power system 7 configured to provide RF power at a second RF frequency. For example, the second RF frequency can be at a relatively higher RF frequency than the first RF frequency. The coupling of RF power to the first and second electrodes facilitates the formation of plasma in the space between the two electrodes. Additionally, plasma processing system 1 comprises a DC power system 5 configured to provide a DC voltage to the second electrode 9 and to monitor the DC current generated through the plasma between the second electrode 9 and a ring electrode 6 that surrounds the first electrode 2, as shown in FIG. 1.

As the etching process proceeds through the layer to be etched and reaches the underlying layer, such as an etch stop layer, the surface chemistry encounters an abrupt change. The evolution of etch products from the layer to be etched decay, and new products possibly arise due to the chemical interaction between the plasma chemistry and the underlying layer. The abrupt change in chemistry causes a variation in the plasma impedance, which, in turn, causes a variation in the imposed DC current that is measured by sensing the DC current through ring electrode 6.

Referring still to FIG. 1, plasma processing system 1 can further comprise a controller 8. The controller 8 can be coupled to the first RF power system 4, the second RF power system 7, and the DC power system 5, and can be configured to exchange data with each of these systems. For example, controller 8 can be configured to receive a signal related to the measured DC current, and process this signal in order to determine the state of the plasma. For example, the controller 8 can correlate a change in the received DC current signal with an endpoint for the etch process. Additionally, for example, the controller 8 can correlate a change in the received DC current with a fault in the etch process.

Here, the coupling of a DC voltage, such as a negative DC voltage, to the second electrode 9 can facilitate the formation of ballistic electron beam as described above. The electron beam power is derived from the superposition of the negative DC voltage on the second electrode 9. As is described in published US patent application no. 2006/0037701A1, the application of negative DC power to the plasma processing system affects the formation of a ballistic (or collision-less) electron beam that strikes the surface of substrate 3.

In general, the imposition of a DC voltage between two electrodes can be implemented with any type of plasma processing system, as will be shown below. In this example, the DC voltage is superimposed on a RF powered capacitively coupled plasma (CCP) processing system between an upper electrode and a ring electrode surrounding the substrate holder. Hence, the invention is not to be limited by this example. It is merely utilized for illustration purposes.

Figure 2:
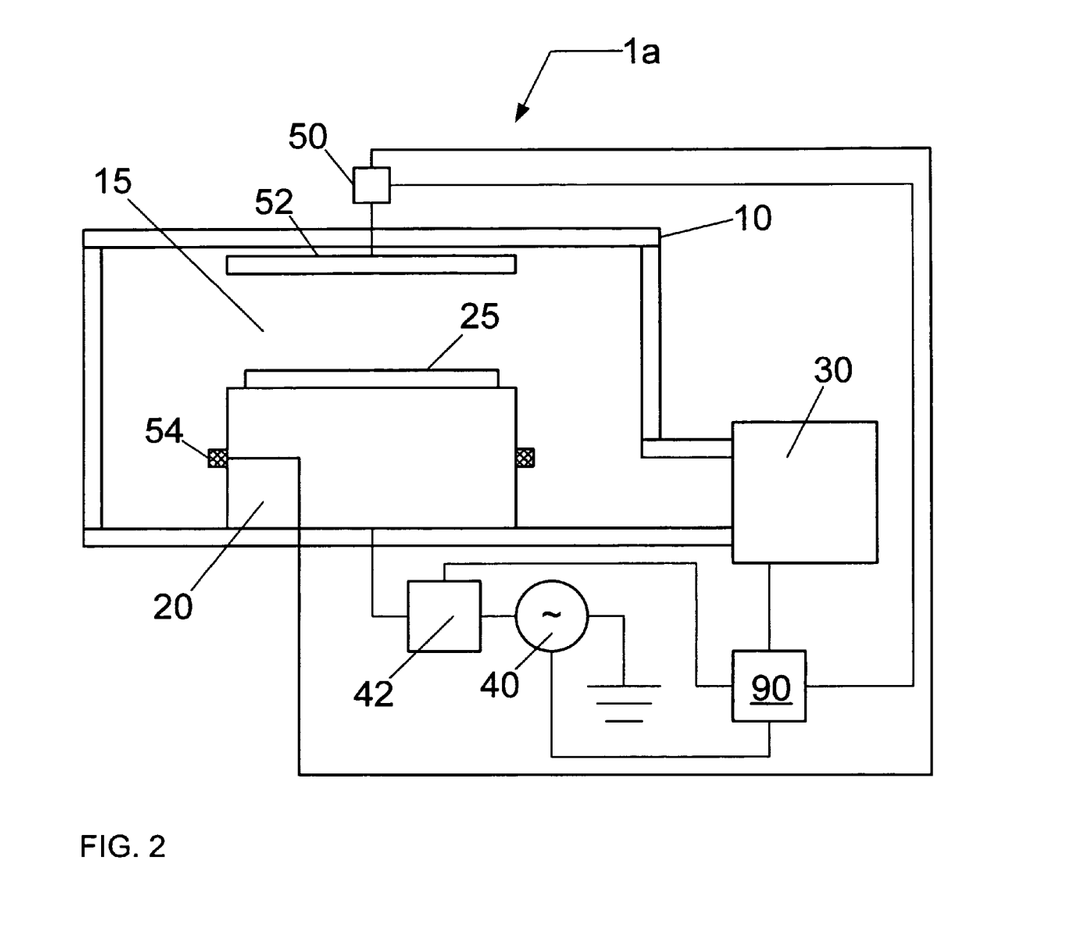
FIG. 2 shows a schematic diagram of a plasma processing system according to another embodiment of the invention.

FIG. 2 illustrates a plasma processing system according to another embodiment. Plasma processing system 1a comprises a plasma processing chamber 10, substrate holder 20, upon which a substrate 25 to be processed is affixed, and vacuum pumping system 30. Substrate 25 can be a semiconductor substrate, a wafer or a liquid crystal display. Plasma processing chamber 10 can be configured to facilitate the generation of plasma in processing region 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1a can be configured to process a substrate of any size, such as 200 mm substrates, 300 mm substrates, or larger.

Substrate 25 can be affixed to the substrate holder 20 via an electrostatic clamping system. Furthermore, substrate holder 20 can further include a cooling system or heating system that includes a re-circulating fluid flow that receives heat from substrate holder 20 and transfers heat to a heat exchanger system (not shown) when cooling, or transfers heat from the heat exchanger system to the fluid flow when heating. Moreover, gas can be delivered to the back-side of substrate 25 via a backside gas system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the backside gas (e.g., helium) pressure can be independently varied between the center and the edge of substrate 25. In other embodiments, heating/cooling elements, such as resistive heating elements, or thermoelectric heaters/coolers can be included in the substrate holder 20, as well as the chamber wall of the plasma processing chamber 10 and any other component within the plasma processing system 1a.

In the embodiment shown in FIG. 2, substrate holder 20 can comprise an electrode through which RF power is coupled to the processing plasma in process space 15. For example, substrate holder 20 can be electrically biased at a RF voltage via the transmission of RF power from a RF generator 40 through an optional impedance match network 42 to substrate holder 20. The RF bias can serve to heat electrons to form and maintain plasma, or affect the ion energy distribution function within the sheath, or both. In this configuration, the system can operate as a reactive ion etch (RIE) reactor, wherein the chamber and an upper gas injection electrode serve as ground surfaces. A typical frequency for the RF bias can range from 0.1 MHz to 100 MHz. RF systems for plasma processing are well known to those skilled in the art.

Furthermore, the amplitude of the RF power coupled to substrate holder 20 can be modulated in order to affect changes in the spatial distribution of the electron beam flux to substrate 25. Additional details can be found in co-pending U.S. patent application Ser. No. 11/XXX,XXX, entitled "Method and system for controlling the uniformity of a ballistic electron beam by RF modulation", filed on even date herewith; the entire contents of which are incorporated by reference in their entirety.

Furthermore, impedance match network 42 serves to improve the transfer of RF power to plasma in plasma processing chamber 10 by reducing the reflected power. Match network topologies (e.g. L-type, π-type, T-type, etc.) and automatic control methods are well known to those skilled in the art.

Referring still to FIG. 2, plasma processing system 1a further comprises a direct current (DC) power system 50 coupled to an upper electrode 52 opposing substrate 25. The upper electrode 52 may comprise an electrode plate. The electrode plate may comprise a silicon-containing electrode plate. Moreover, the electrode plate may comprise a silicon electrode plate or a doped silicon electrode plate. The DC power system 50 can include a variable DC power supply. Additionally, the DC power system 50 can include a bipolar DC power supply. The DC power system 50 further includes a system configured to measure the DC current between the upper electrode 52 and a ring electrode 54 surrounding substrate holder 20. Hence, the DC power system 50 is configured to couple one terminal to upper electrode 52 and the other terminal to ring electrode 54 through substrate holder 20. The ring electrode 54 may comprise a silicon-containing ring electrode. For example, the ring electrode 54 may comprise a silicon ring electrode or a doped-silicon ring electrode.

The DC power system 50 can further include a system configured to perform at least one of monitoring, adjusting, or controlling the polarity, current, voltage, or on/off state. Once plasma is formed, the DC power supply 50 can facilitate the formation of a ballistic electron beam. An electrical filter may be utilized to de-couple RF power from the DC power system 50.

For example, the DC voltage applied to electrode 52 by DC power system 50 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 52. The surface of the upper electrode 52 facing the substrate holder 20 may be comprised of a silicon-containing material.

Vacuum pumping system 30 can include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP can be employed. TMPs can be used for low pressure processing, typically less than 50 mTorr. For high pressure processing (i.e., greater than 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Referring still to FIG. 2, plasma processing system 1a further comprises a controller 90 that comprises a microprocessor, memory, and a digital I/O port capable of generating control voltages sufficient to communicate and activate inputs to plasma processing system 1a as well as monitor outputs from plasma processing system 1a. Moreover, controller 90 can be coupled to and can exchange information with RF generator 40, impedance match network 42, DC power system 50, the gas injection system (not shown), vacuum pumping system 30, as well as the backside gas delivery system (not shown), the substrate/substrate holder temperature measurement system (not shown), and/or the electrostatic clamping system (not shown). A program stored in the memory can be utilized to activate the inputs to the aforementioned components of plasma processing system 1a according to a process recipe in order to perform the method of etching a thin film. One example of controller 90 is a DELL PRECISION WORKSTATION 610™, available from Dell Corporation, Austin, Tex.

Controller 90 can be configured to receive a signal related to the measured DC current, and process this signal in order to determine the state of the plasma. The controller 90 can correlate a change in the received DC current signal with an endpoint for the etch process. Additionally, the controller 90 can correlate a change in the received DC current with a fault in the etch process. For example, when either the signal exceeds or falls below a threshold value, endpoint can be inferred. Alternatively, when a first derivative (i.e., slope) of the signal exceeds a threshold value, endpoint can be inferred. Alternatively, when a second derivative crosses zero, an endpoint can be inferred. Controller 90 can be configured to process the raw data signal from the DC power system 50. For instance, the raw signal may be filtered to remove noise.

Controller 90 may be locally located relative to the plasma processing system 1a, or it may be remotely located relative to the plasma processing system 1a via an internet or intranet. Thus, controller 90 can exchange data with the plasma processing system 1a using at least one of a direct connection, an intranet, or the internet. Controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, or the internet.

In the embodiment shown in FIG. 3, the plasma processing system 1b can be similar to the embodiment of FIG. 2 and further comprise either a stationary, or mechanically or electrically rotating magnetic field system 60, in order to potentially increase plasma density and/or improve plasma processing uniformity, in addition to those components described with reference to FIG. 2. Moreover, controller 90 can be coupled to magnetic field system 60 in order to regulate the speed of rotation and field strength. The design and implementation of a rotating magnetic field is well known to those skilled in the art.

Figure 3:
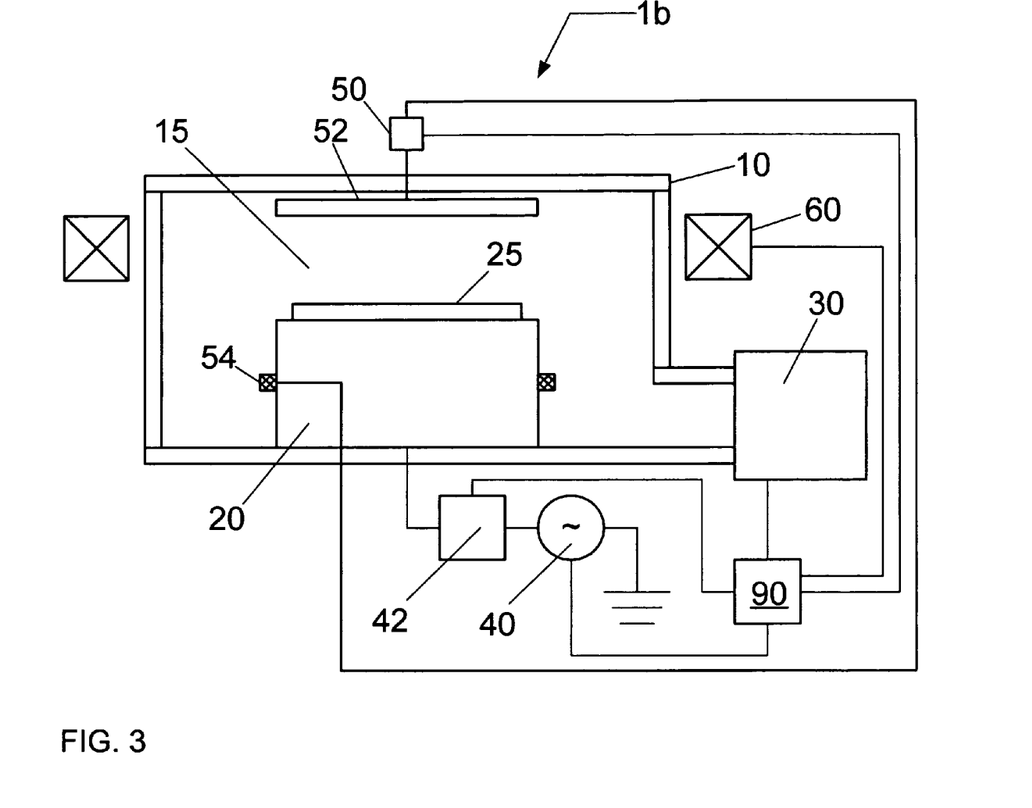
FIG. 3 shows a schematic diagram of a plasma processing system according to another embodiment of the invention.
Figure 4:
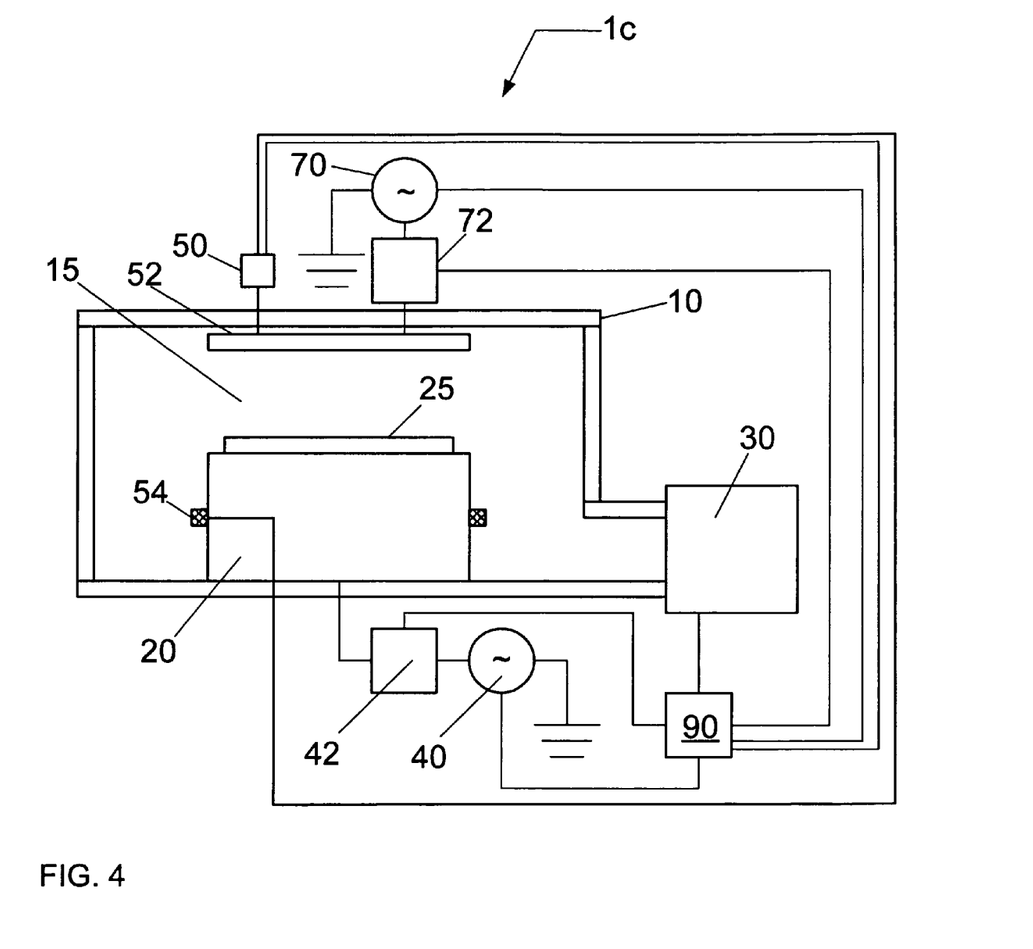
FIG. 4 shows a schematic diagram of a plasma processing system according to another embodiment of the invention.

In the embodiment shown in FIG. 4, the plasma processing system 1c can be similar to the embodiment of FIG. 2 or FIG. 3, and can further comprise an RF generator 70 configured to couple RF power to upper electrode 52 through an optional impedance match network 72. A typical frequency for the application of RF power to upper electrode 52 can range from about 0.1 MHz to about 200 MHz. Additionally, a typical frequency for the application of power to the substrate holder 20 (or lower electrode) can range from about 0.1 MHz to about 100 MHz. For example, the RF frequency coupled to the upper electrode 52 can be relatively higher than the RF frequency coupled to the substrate holder 20. Furthermore, the RF power to the upper electrode 52 from RF generator 70 can be amplitude modulated, or the RF power to the substrate holder 20 from RF generator 40 can be amplitude modulated, or both RF powers can be amplitude modulated. Desirably, the RF power at the higher RF frequency is amplitude modulated. Moreover, controller 90 is coupled to RF generator 70 and impedance match network 72 in order to control the application of RF power to upper electrode 70. The design and implementation of an upper electrode is well known to those skilled in the art.

Referring still to FIG. 4, the DC power supply 50 may be directly coupled to upper electrode 52, or it may be coupled to the RF transmission line extending from an output end of impedance match network 72 to upper electrode 52. An electrical filter may be utilized to de-couple RF power from DC power supply 50.

Figure 5:
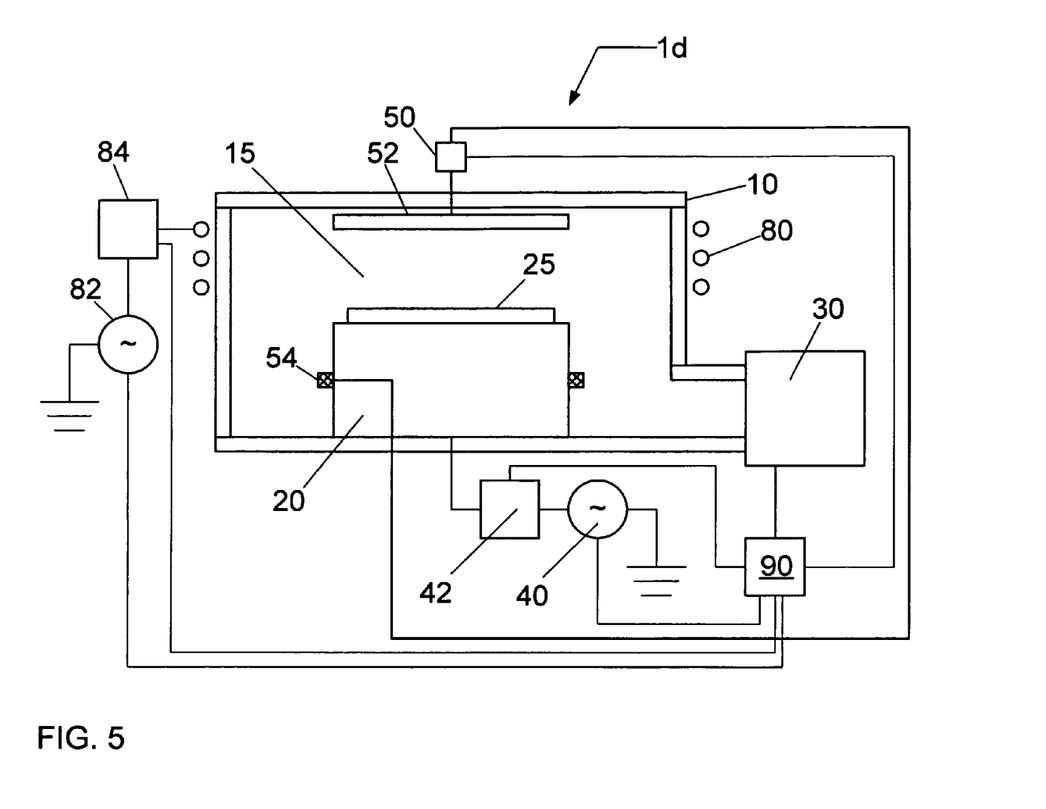
FIG. 5 shows a schematic diagram of a plasma processing system according to another embodiment of the invention.

In the embodiment shown in FIG. 5, the plasma processing system 1d can, for example, be similar to the embodiments of FIGS. 2, 3 and 4, and can further comprise an inductive coil 80 to which RF power is coupled via RF generator 82 through an optional impedance match network 84. RF power is inductively coupled from inductive coil 80 through a dielectric window (not shown) to plasma processing region 15. A typical frequency for the application of RF power to the inductive coil 80 can range from about 10 MHz to about 100 MHz. Similarly, a typical frequency for the application of power to the chuck electrode can range from about 0.1 MHz to about 100 MHz. In addition, a slotted Faraday shield (not shown) can be employed to reduce capacitive coupling between the inductive coil 80 and plasma. Moreover, controller 90 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 6:
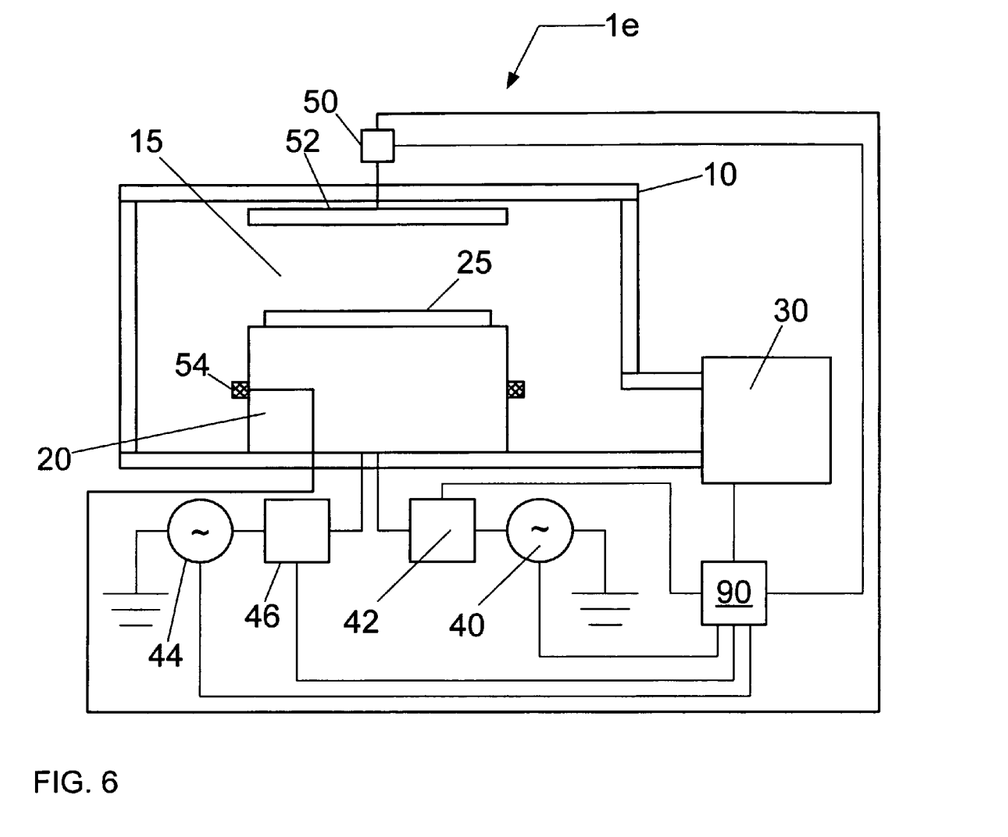
FIG. 6 shows a schematic diagram of a plasma processing system according to another embodiment of the invention.

In the embodiment shown in FIG. 6, the plasma processing system 1e can, for example, be similar to the embodiments of FIGS. 2, 3, 4 and 5, and can further comprise a second RF generator 44 configured to couple RF power to substrate holder 20 through another optional impedance match network 46. A typical frequency for the application of RF power to substrate holder 20 can range from about 0.1 MHz to about 200 MHz for either the first RF generator 40 or the second RF generator 44 or both. The RF frequency for the second RF generator 44 can be relatively greater than the RF frequency for the first RF generator 44. Furthermore, the RF power to the substrate holder 20 from RF generator 40 can be amplitude modulated, or the RF power to the substrate holder 20 from RF generator 44 can be amplitude modulated, or both RF powers can be amplitude modulated. Desirably, the RF power at the higher RF frequency is amplitude modulated. Moreover, controller 90 is coupled to the second RF generator 44 and impedance match network 46 in order to control the application of RF power to substrate holder 20. The design and implementation of an RF system for a substrate holder is well known to those skilled in the art.

Figure 7:
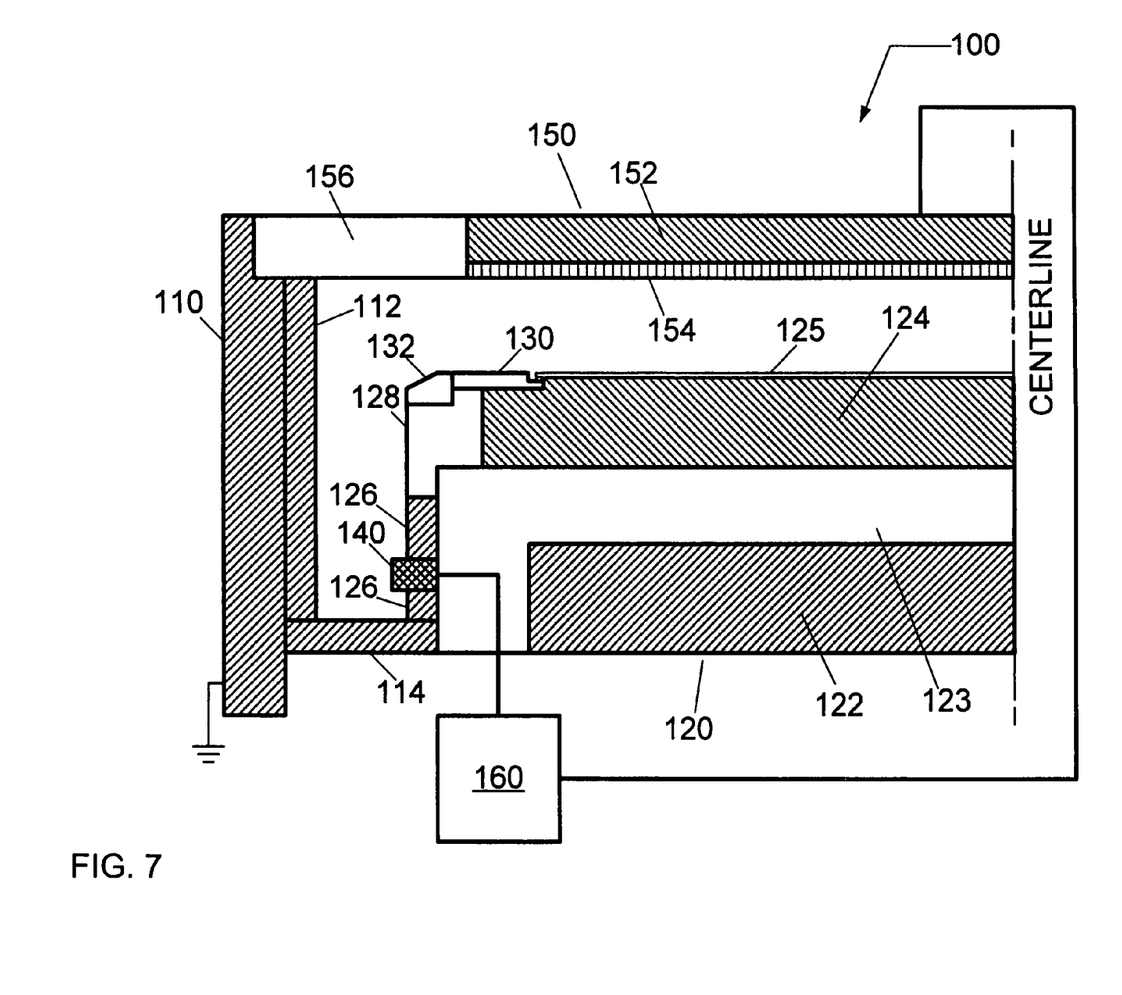
FIG. 7 presents a cross-sectional view of a diagnostic system for a plasma processing system according to another embodiment of the invention.

Referring now to FIG. 7, a cross-sectional view of a plasma processing system 100 is provided according to another embodiment. The plasma processing system 100 comprises a lower electrode assembly 120 and an upper electrode assembly 150 disposed opposite each other within a process chamber 110, wherein the lower electrode assembly 120 is configured to support a substrate 125.

The lower electrode assembly 120 comprises an electrode base 122 coupled to electrical ground and a lower electrode 124, wherein the lower electrode 124 is configured to be electrically insulated from the electrode base 122 and the process chamber 110 via electrode base insulator 123 and lower electrode insulator ring 128. The process chamber 110, including chamber liner 112 and exhaust plate 114, can be maintained at an electrical potential different than the lower electrode 124 and, for instance, they may be maintained at electrical ground. The lower electrode assembly 120 can further include a focus ring 130 configured to surround the peripheral edge of substrate 125 and an edge ring 132 configured to protect the peripheral corner of the lower electrode assembly 120. The lower electrode 124 may be coupled to a first RF power system configured to provide RF power at a first RF frequency. Furthermore, the lower electrode 124 can include an electrostatic chuck (ESC) and may include a back-side gas supply system and temperature control elements, such as heating or cooling elements or both, as described above Additionally, the upper electrode assembly 150 comprises an upper electrode 152 and an electrode plate 154, and it is electrically insulated from process chamber 110 via insulator ring 156. The upper electrode 150 may be coupled to a second RF power system configured to provide RF power at a second RF frequency. For example, the second RF frequency can be at a relatively higher RF frequency than the first RF frequency. The coupling of RF power to the first and second electrodes facilitates the formation of plasma in the space between the two electrodes.

Furthermore, the lower electrode assembly 120 comprises an outer ground wall 126 and a ring electrode 140. The ring electrode 140 may comprise a silicon-containing ring electrode. For example, the ring electrode 140 may comprise a silicon ring electrode or a doped-silicon ring electrode. Plasma processing system 100 further comprises a DC power system 160 configured to provide a DC voltage to the upper electrode 152 and to monitor the DC current generated through the plasma between the upper electrode 152 and the ring electrode 140 that surrounds the lower electrode 124, as shown in FIG. 7. The DC current is then utilized to determine the state of the plasma. For example, a change in the received DC current signal can be correlated with an endpoint for the etch process. Additionally, for example, a change in the received DC current can be correlated with a fault in the etch process.

In the following discussion, a method of etching a thin film utilizing a plasma processing system is presented. For example, the plasma processing system can comprise various elements, such as described in FIGS. 1 through 7, and combinations thereof.

Figure 8:
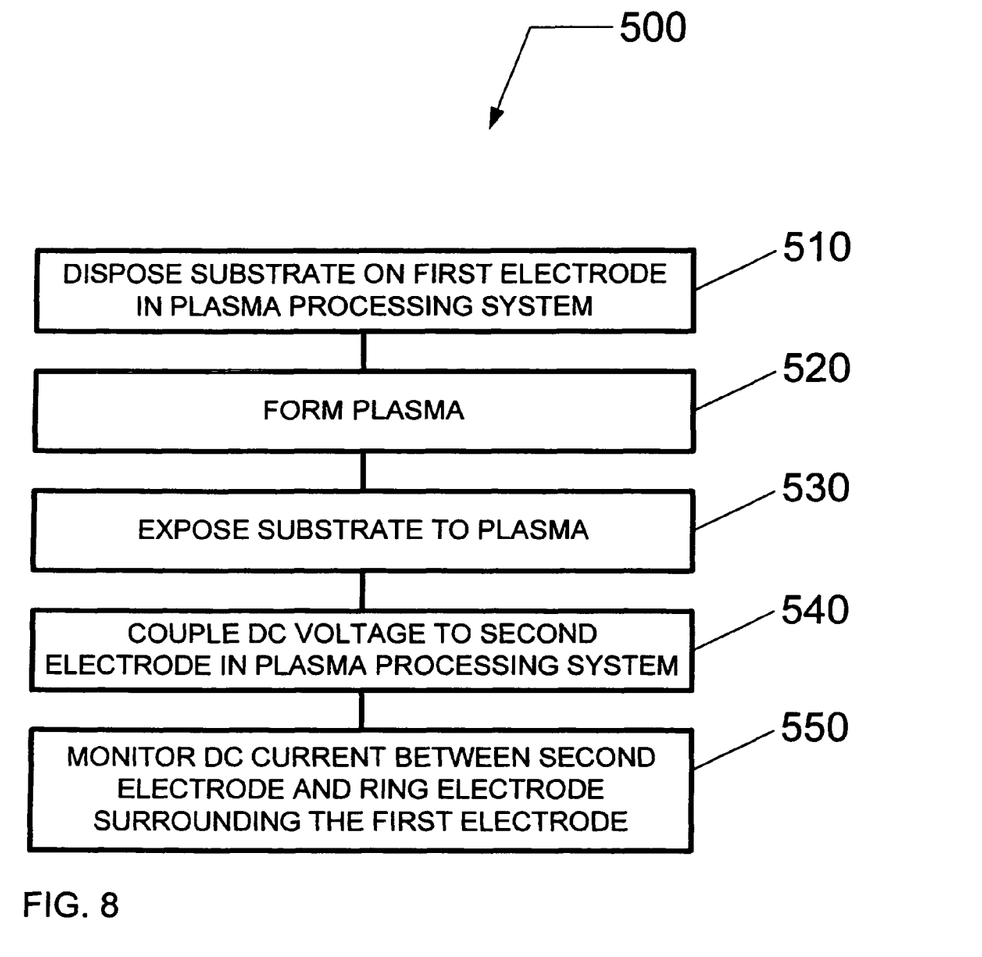
FIG. 8 illustrates a method of treating a substrate using plasma according to another embodiment of the invention.

FIG. 8 presents a flow chart of a method for etching a thin film using a plasma processing system according to an embodiment of the present invention. Procedure 500 begins at 510 with disposing a substrate on a substrate holder in a plasma processing system configured to form plasma and a ballistic electron beam.

In 520, plasma is formed by coupling electromagnetic (EM) power to the plasma processing system. For example, RF power can be coupled, via any one of the configurations provided in FIGS. 1 through 7, to a process gas in a space above the substrate. In 530, the substrate is exposed to plasma and the associated plasma chemistry in order to perform an etching process.

In 540, DC voltage is coupled to the plasma processing system. For example, the DC voltage is applied to an electrode opposing the substrate. DC voltage applied to the plasma processing system by a DC power system may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than that is a self-bias voltage generated on an electrode surface of the plasma processing system.

In 550, the DC power system is utilized to monitor the DC current formed through the plasma between the electrode to which the DC voltage is applied, and a ring electrode surrounding the substrate holder upon which the substrate rests. The DC current is then utilized to determine the state of the plasma. For example, a change in the received DC current signal can be correlated with an endpoint for the etch process. Additionally, for example, a change in the received DC current can be correlated with a fault in the etch process.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of determining an endpoint for an etch process using a plasma processing system, comprising:
   disposing a substrate on a first electrode in said plasma processing system;
   forming plasma by coupling radio frequency (RF) power to said plasma processing system;
   exposing said substrate to said plasma to facilitate an etch process;
   coupling a direct current (DC) voltage to a second electrode opposing said first electrode;
   measuring the DC current through said plasma between said second electrode and a ring electrode surrounding said first electrode; and
   determining an endpoint for said etch process by detecting a change in the DC current through the plasma between the second electrode and the ring electrode.

2. The method of claim 1, wherein said coupling a DC voltage comprises coupling a DC voltage ranging from approximately −2000 V (volts) to approximately −500 V.

3. The method of claim 1, wherein said coupling a DC voltage comprises coupling a DC voltage ranging from approximately −1700 V (volts) to approximately −700 V.

4. The method of claim 1, wherein said coupling a DC voltage comprises coupling a DC voltage having a negative polarity, wherein the absolute value of the DC voltage is greater than or equal to approximately 500 V.

5. The method of claim 1, wherein said measuring the DC current includes measuring the DC current through said plasma between said second electrode and a silicon-containing ring electrode surrounding said first electrode.

6. The method of claim 1, wherein said measuring the DC current includes measuring the DC current through said plasma between said second electrode and a silicon ring electrode surrounding said first electrode.

7. The method of claim 1, wherein said measuring the DC current includes measuring the DC current through said plasma between said second electrode and a doped-silicon ring electrode surrounding said first electrode.

8. The method of claim 1, wherein said forming plasma comprises coupling RF power to said first electrode or said second electrode or both.

9. The method of claim 1, wherein said forming plasma comprises coupling RF power to an inductive coil.

10. The method of claim 1, further comprising:
providing a magnetic field in the plasma processing system with a magnetic field system; and
controlling the speed of rotation or the field strength of the magnetic field with a controller.

11. The method of claim 1, wherein said forming plasma comprises coupling a first RF power to said first electrode at a first RF frequency and coupling a second RF power to said second electrode or said first electrode at a second RF frequency.

12. The method of claim 11, wherein said first RF frequency is less than said second RF frequency.

* * * * *